US006557618B1

(12) United States Patent
Kablov et al.

(10) Patent No.: US 6,557,618 B1
(45) Date of Patent: May 6, 2003

(54) APPARATUS AND METHOD FOR PRODUCING CASTINGS WITH DIRECTIONAL AND SINGLE CRYSTAL STRUCTURE AND THE ARTICLE ACCORDING TO THE METHOD

(75) Inventors: Vegeny Nikolaevich Kablov, Moscow (RU); Viktor Vladimirovich Gerasimov, Moscow (RU); Joseph Markovich Demonis, Moscow (RU); Elena Mikhailovna Visik, Moscow (RU)

(73) Assignees: General Electric Company, Schenectady, NY (US); All-Russian Scientific Research Institute of Aviation Materials, Moscow (RU)

( * ) Notice: Subject to any disclaimer, the term of this patent is extended or adjusted under 35 U.S.C. 154(b) by 0 days.

(21) Appl. No.: 09/331,001

(22) PCT Filed: Sep. 14, 1998

(86) PCT No.: PCT/US98/19020
§ 371 (c)(1),
(2), (4) Date: Apr. 27, 2000

(87) PCT Pub. No.: WO99/13137

PCT Pub. Date: Mar. 18, 1999

(30) Foreign Application Priority Data

Sep. 12, 1997 (RU) .......................................... 971155083

(51) Int. Cl.[7] .............................................. B22D 27/00
(52) U.S. Cl. .................. 164/122.1; 164/125; 164/338.1
(58) Field of Search ............................. 164/122, 122.1, 164/122.2, 123–128, 338.1

(56) References Cited

U.S. PATENT DOCUMENTS 3,680,028 A    7/1972   Black et al. ................. 338/308
3,690,368 A  * 9/1972   Copley et al. ............... 164/350
3,895,672 A  * 7/1975   King et al. .................. 164/127
3,915,761 A  * 10/1975  Tschinkel et al. ............ 148/404
4,763,716 A    8/1988   Graham et al. ........... 164/122.1
4,813,470 A  * 3/1989   Chiang ..................... 164/122.1
5,066,223 A    11/1991  Mosch ........................ 432/184
5,900,059 A  * 5/1999   Shimanuki et al. ......... 117/217

FOREIGN PATENT DOCUMENTS

DE           4022389         2/1992

(List continued on next page.)

OTHER PUBLICATIONS

Patent Abstracts of Japan, vol. 098, No. 004, Mar. 31, 1998, & JP 09–315882, (Komatsu Electron Metals Co Ltd, Dec. 9, 1997.

*Primary Examiner*—M. Alexandra Elve
*Assistant Examiner*—Kevin McHenry
(74) *Attorney, Agent, or Firm*—Jay L. Chaskin

(57) ABSTRACT

The present invention relates to metal casting and can be used in producing large sized blades with directional and single crystal structure having large horizontal shoulders. The apparatus comprises a vacuum chamber inside which there is positioned a mold preheating furnace with a ceramic mold and a vertical shield disposed therein, and a crystallizer. The shield is positioned concentrically to the casting vertical axis and is fixed on the mold upper portion or on a hanger. The shield can be made integral or as a row of members having projecting flanges which telescopically insert into each other. The shield is made of a graphitized foil or a carbon/carbon based composite material. The disclosed apparatus allows to decrease the role of the radial component of the thermal gradient in the process of directional solidification of the blades having large horizontal shoulders, to increase the degree of structural perfection along the complete height of a casting and to avoid porosity in the transition portion between a shroud and an airfoil.

23 Claims, 2 Drawing Sheets

FOREIGN PATENT DOCUMENTS

| | | |
|---|---|---|
| DE | 4321640 | 1/1995 |
| EP | 0589508 | 3/1994 |
| GB | 1285319 | 8/1972 |
| GB | 1303028 | 1/1973 |
| GB | 1562368 | 3/1980 |
| WO | 9605006 | 3/1996 |

* cited by examiner

1. Radiation heating
2. Radiation cooling

PRIOR ART

APPARATUS AND METHOD FOR PRODUCING CASTINGS WITH DIRECTIONAL AND SINGLE CRYSTAL STRUCTURE AND THE ARTICLE ACCORDING TO THE METHOD

This is the national stage application of International Application No. PCT/US98/19020 filed Sep. 14, 1998.

FIELD OF THE INVENTION

The present invention relates to metal casting and can be used in producing large sized blades with directional and single crystal structure having large horizontal shoulders.

Apparatuses for casting blades by directional solidification methods are known. Such apparatuses include a heating zone and a cooling zone, which are separated by a horizontal shield or baffle. In instances where a chill plate acts as a cooling zone, then a rigid baffle is used as a rule, as described in U.S. Pat. Nos. 3,680,028 and 4,763,716, UK Patent Application Nos. 1,285,319 and 1,562,368, and EP 0589508, Patentschrift 4022389. When cooling is performed by a liquid metal bath, then, besides the rigid baffle, one can use a baffle floating on the surface of the coolant (see German Patent 4,321,640; PCT Application 096/05006, Russian Federation Patent 1,401,715).

The horizontal shields or baffles create a heat barrier between the heating zone and the cooling zone in the apparatuses in order to increase the thermal gradient at the crystal growth front of the cast article (the blade). But when it is necessary to produce blades having large horizontal shoulders, the construction of said shields or baffles should correspond to the maximum size of a blade in a horizontal direction, which decreases the shielding effect and does not ensure the desired crystal structure.

The closest to the present invention is the apparatus disclosed in UK Patent Application No. 1,303,038 being accepted as a prototype. The prototype apparatus consists of a vacuum chamber, inside which a furnace for mold pre-heating is disposed. Disposed inside the furnace is a ceramic cluster of several blades being positioned on a chill plate. Placed between the cluster central part and a casting cavity is a closed shield which has the shape of a circular cavity. Said shield is produced jointly with a ceramic mold, is rigidly connected with it and assists in uniform heating of all the castings in a cluster along its height and also assists in decreasing the mutual effect of the ceramic cluster on the cooling process.

All the above mentioned apparatuses with shields or baffles, including the prototype apparatus, in the process of lowering the mold into the cooling zone from the heating zone, do not decrease the radial component of the thermal gradient and are not acceptable for casting blades with large horizontal shoulders. As a result structural defects and increased porosity in the transition portion of the blade between the shroud and an airfoil are caused.

SUMMARY OF THE INVENTION

The technical task of the present invention is to improve the structure of the casting (i.e., the absence of high and low angle grain boundaries) due to decreasing the radial component of the thermal gradient without changing the temperature axial gradient value in the course of the solidification process. Another aim of the invention is also to improve the yield of single crystal structure in the blade. To achieve this task, the inventive apparatus comprises a vacuum chamber inside which there is positioned a mold preheating furnace with a ceramic mold and a vertical shield disposed therein, and a crystallizer (cooling zone). The vertical shield is made separate from the ceramic mold and is positioned concentrically to the casting's vertical axis; its lower butt end is open and faces the crystallizer. The shield can be made integral of thin graphitized foil having graphite bushes on the butt ends, or can be made as a row of members having projecting flanges which telescopically insert into each other. The number and the height of these members are defined constructively and are dependent on blade sizes. The shield is fixed on the mold upper portion or on a mold hanger. The shield should be made of a heat insulative material such as, but not limited to, graphitized foil, layers of graphite with felt, and composite materials based on carbon/carbon.

Figure 1B:
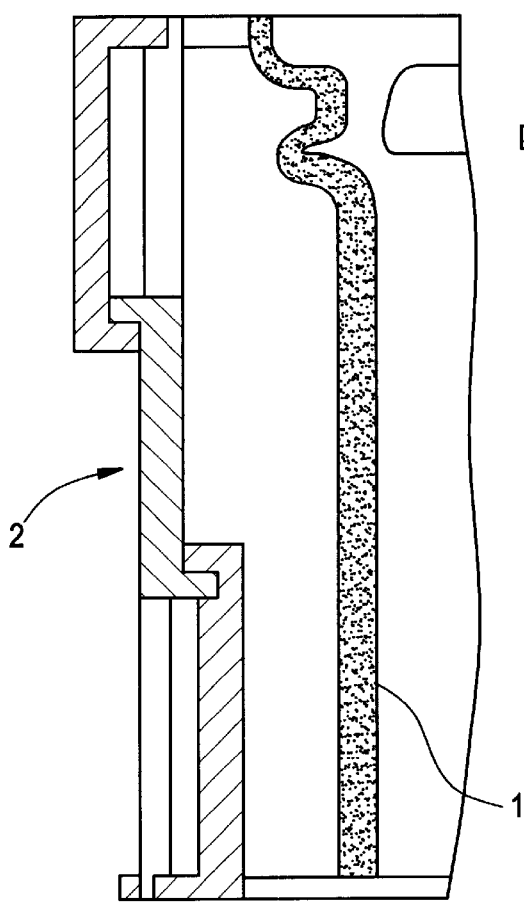
FIG. 1b shows the shield being made of the members telescopically inserting into each other.
Figure 1A:
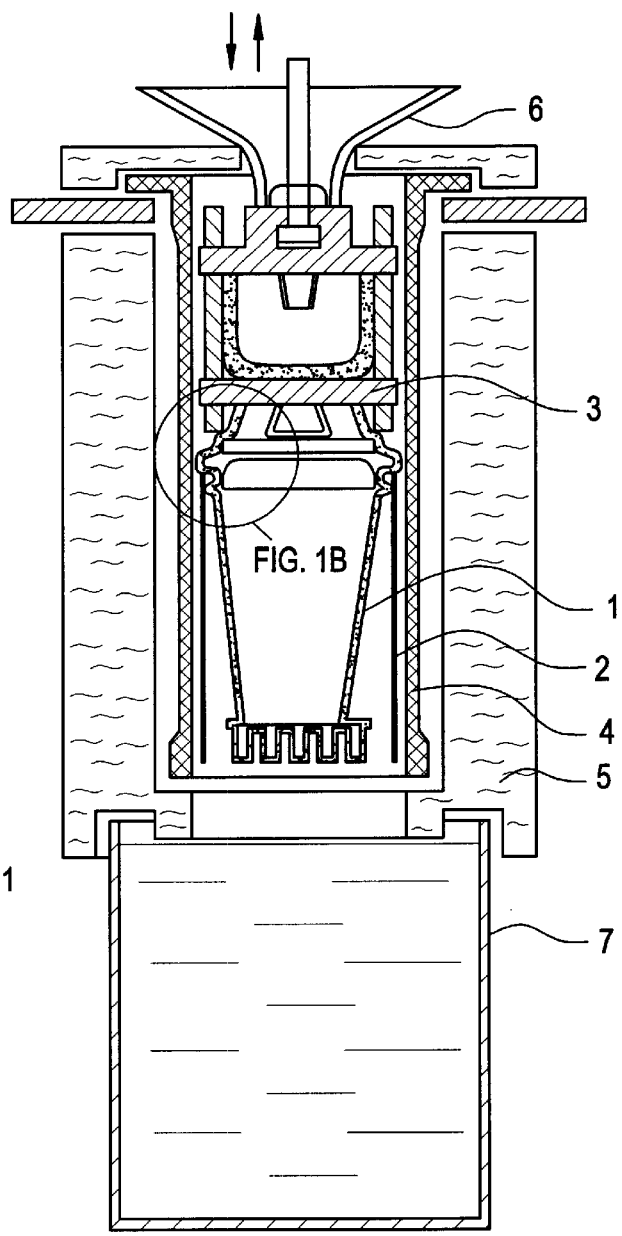
FIG. 1a is a schematic representation of the apparatus for casting the blades with large horizontal shoulders, and the shield being opened from the bottom, where the following parts are shown: a ceramic mold (1) for blades, a vertical shield (2), a hanger (3) for molds, a mold preheating furnace (4), furnace insulation (5), a cup for melt pouring (6) and the liquid metal crystallizer (7).

DESCRIPTION OF THE INVENTION.

The apparatus works as follows: the mold 1 is surrounded by the vertical shield 2 which is opened from the bottom. The hanger 3 holds the mold in the preheating furnace 4 being embraced by the heat insulation 5. Once the desired temperature has been achieved, the molten superalloy is poured into the mold through the cup 6. After that, the mold is immersed into the liquid metal crystallizer 7 at the predetermined rate. When the blade dimensions are not large, the shield can be made integral of thin graphitized foil having graphite bushes on the butt ends. When the blade dimensions are large, the shield can be made as a row of members, e.g., rings telescopically inserting into each other in the course of directional solidification. As a result, the shield usage efficiency is increased and it is convenient in service. To produce the blades having single crystal structure, the seed with the desired crystallographic orientation is placed inside the mold before the molten alloy is poured into the mold.

In the directional solidification process the vertical shield in the gap between the preheating furnace and the liquid metal coolant level, serves to prevent heat losses in a radial direction and simultaneously does not allow the horizontal shoulders to receive the additional heat flow from the heater while not interrupting the coolant's influence. This helps to provide strict unidirectional axial heat removal from a solidifying casting and also enables avoiding the porosity in the transition portion between a shroud and an airfoil.

Figure 2C:
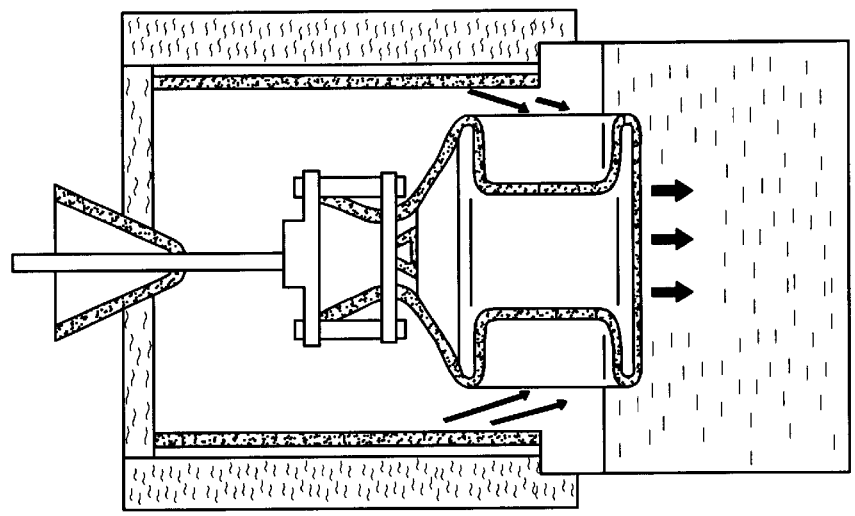
FIG. 2c illustrates the cooling scheme of a blade having large horizontal shoulders when directional solidification is performed using the liquid metal crystallizer and the inventive vertical shield.
Figure 2B:
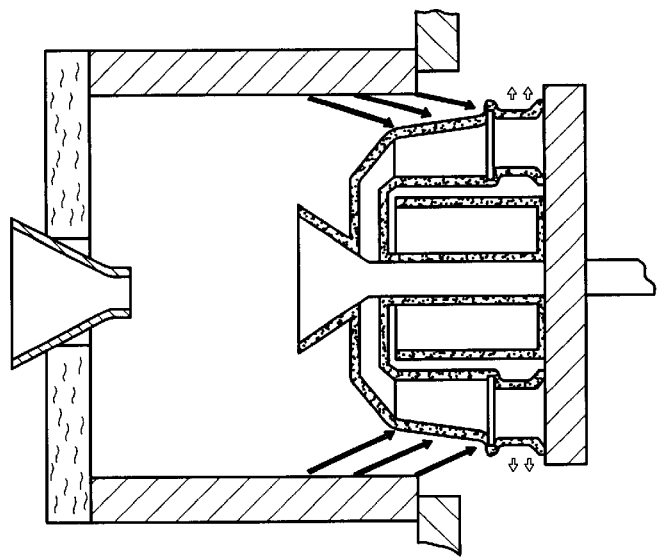
FIG. 2b illustrates how the cluster of the blades is cooled according to the prototype method where the shield construction prevents heating up the blades from inside of the cluster, but doesn't prevent overheating of the transition portion between the shroud and the airfoil.
Figure 2A:
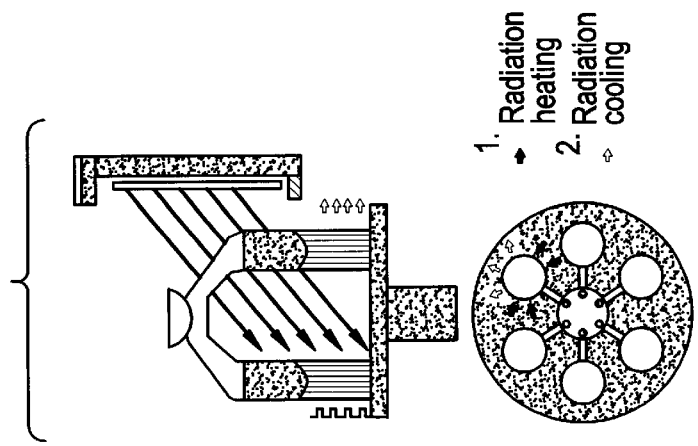
FIG. 2a illustrates the conventional technique for casting the blades with directional and single crystal structure.

FIG. 2a illustrates the conventional technique for casting the blades with directional and single crystal structure. In such a case the cooling of a cluster is effective only over the cluster's periphery but inside the article can be still heated from above.

FIG. 2b illustrates how the cluster of the blades is cooled according to the prototype method; the shield construction prevents heating up the blades from inside of the cluster, but doesn't prevent overheating of the transition portion between a shroud and an airfoil. That is why the blade has defects in its structure.

FIG. 2c illustrates the cooling scheme of a blade having large horizontal shoulders when directional solidification is performed using the liquid metal crystallizer and the suggested vertical shield. The shield acts during the complete process of mold immersion, and the degree of perfection is preserved along the complete height of the structure due to the fact that the suggested apparatus provides the directional solidification without the radial component of the heat flow which has been the main reason for causing the low angle grain boundaries.

The disclosed apparatus allows to decrease the role of the radial component of the thermal gradient in the process of directional solidification of the blades having large horizontal shoulders, to increase the degree of structural perfection along the complete height of a casting, to avoid porosity in the transition portion between a shroud and an airfoil, and to improve the yield of single crystal structure by 10–20%.

Said vertical shield can be used in the installations with both a liquid metal crystallizer and a conventional crystallizer (a chill plate).

Various modifications in structure and/or steps and or features and/or elements of the disclosed invention can be made by one skilled in the art without departing from the scope and extent of the claims.

What is claimed:

1. An apparatus for producing a casting with directional and single crystal structure, comprising:
   a vacuum chamber;
   a mold preheating furnace inside the chamber;
   a ceramic mold inside the furnace having a vertical casting axis and an axial extent;
   a crystallizer; and
   a vertical shield disposed in the furnace, and separate from and surrounding the ceramic mold and positioned concentrically to the casting vertical axis, the shield having an open lower butt end which faces the crystallizer and an axial extent along the vertical axis substantially equal to the axial extent of the mold.

2. The apparatus of claim 1 wherein the shield is made of a row of members telescopically inserting into each other in the directional solidification process.

3. The apparatus of claim 1 where the shield has graphite bushes on the butt end.

4. The apparatus of claim 1 wherein the shield is made of a heat insulative material selected from the group consisting of graphite foil, layers of graphite with felt between the graphite, a composite material based on carbon/carbon and mixtures thereof.

5. The apparatus of claim 1 wherein the shield is fixed on the mold.

6. The apparatus of claim 1 comprising a mold hanger and the shield is fixed on the hanger.

7. The apparatus of claim 1 wherein the shield is disposed between the mold and the furnace.

8. A method of making a directional or single crystal structure comprising the steps of:
   melting an alloy;
   pouring the alloy from a cup into a heated mold, the heated mold being surrounded by a vertical shield having an axial extent substantially equal to the axial extent of the mold; and
   lowering the mold into a crystallizer at a predetermined rate to produce the directional structure or single crystal structure.

9. An article made according to the method of claim 8.

10. An article according to claim 9 with reduced low angle grain boundaries in comparison to a casting made by a process the shield.

11. An article according to claim 9 comprising a casting with a large horizontal shoulder having reduced low angle grain boundaries as compared to a casting made by a process without the shield.

12. An article according to claim 9 being a casting with directional solidification with reduced porosity in shoulders formed on the casting as compared to a casting made without the shield.

13. An article according to claim 9 wherein the article is a turbine blade.

14. An apparatus for producing a casting comprising:
   means for providing a vacuum;
   means for providing a heating zone, the heating zone being disposed in the means for providing a vacuum;
   means for providing a mold for producing the casting;
   means for providing a cooling zone adjacent to the heating zone; and
   means for providing a shield for decreasing a radial component of a thermal gradient produced by the heating zone, the means for providing a shield arranged concentrically with a vertical axis of the mold and surrounding the mold, the shield having an axial extent along the vertical axis substantially equal to the axial extent of the mold.

15. An apparatus for producing a casting with directional and single crystal structure, comprising:
   a vacuum chamber;
   a mold preheating furnace inside the chamber;
   a ceramic mold inside the furnace having a vertical casting axis and an axial extent;
   a crystallizer;
   a vertical shield disposed in the furnace, and separate from and surrounding the ceramic mold and positioned concentrically to the casting vertical axis, the shield having an open lower butt end which faces the crystallizer, and wherein the shield is made of a heat insulative material selected from the group consisting of graphite foil, layers of graphite with felt between the graphite, a composite material based on carbon/carbon and mixtures thereof.

16. An apparatus for producing a casting with directional and single crystal structure, comprising:
   a vacuum chamber;
   a mold preheating furnace inside the chamber;
   a ceramic mold inside the furnace having a vertical casing axis and an axial extent;
   a crystallizer;
   a vertical shield disposed in the furnace, and separate from and surrounding the ceramic mold and positioned concentrically to the casting vertical axis, the shield having an open lower butt end which faces the crystallizer, and
   wherein the shield is fixed on the mold.

17. An apparatus for producing a casting with directional and single crystal structure, comprising:

a vacuum chamber;

mold preheating furnace inside the chamber;

a ceramic mold inside the furnace having a vertical casting axis and an axial extent;

a crystallizer;

a vertical shield disposed in the furnace, and separate from and surrounding the ceramic mold and positioned concentrically to the casting vertical axis, the shield having an open lower butt end which faces the crystallizer; and a mold hanger and the shield is fixed on the hanger.

18. A method for producing a casting comprising:

providing a vacuum;

providing a heating zone, the heating zone being disposed in the vacuum;

providing a mold for producing the casting;

providing a cooling zone adjacent to the heating zone; and providing a shield for decreasing a radial component of a thermal gradient produced by the heating zone, the shield arranged concentrically with a vertical axis of the mold and surrounding the mold, the shield having an axial extent along the vertical axis substantially equal to the axial extent of the mold.

19. An article made according to the method of claim 18.

20. An article according to claim 19 with reduced low angle grain boundaries in comparison to a casting made by a process without the shield.

21. An article according to claim 19 comprising a casting with a large horizontal shoulder having reduced low angle grain boundaries as compared to a casting made by a process without the shield.

22. An article according to claim 19 being a casting with directional solidification with reduced porosity in shoulders formed on the casting as compared to a casting made without the shield.

23. An article according to claim 19 wherein the article is a turbine blade.

* * * * *